United States Patent
Sankaran et al.

(10) Patent No.: US 10,320,589 B1
(45) Date of Patent: Jun. 11, 2019

(54) SIGNAL ISOLATION CIRCUIT

(71) Applicant: Texas Instruments Incorporated, Dallas, TX (US)

(72) Inventors: Swaminathan Sankaran, Allen, TX (US); Bradley Allen Kramer, Plano, TX (US); Baher Haroun, Allen, TX (US); Tobias Bernhard Fritz, Mainburg (DE); Ernst Georg Muellner, Munich (DE); Ralf Peter Brederlow, Poing (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/859,419

(22) Filed: Dec. 30, 2017

(51) Int. Cl.
| | |
|---|---|
| H04L 25/02 | (2006.01) |
| H05K 1/02 | (2006.01) |
| H04B 3/54 | (2006.01) |
| G01R 31/317 | (2006.01) |
| H04B 1/525 | (2015.01) |
| H03K 17/693 | (2006.01) |

(52) U.S. Cl.
CPC .... H04L 25/0276 (2013.01); G01R 31/31706 (2013.01); H03K 17/693 (2013.01); H04B 1/525 (2013.01); H04B 3/542 (2013.01); H05K 1/0233 (2013.01)

(58) Field of Classification Search
None
See application file for complete search history.

(56) References Cited

U.S. PATENT DOCUMENTS

| | | | | |
|---|---|---|---|---|
| 6,297,729 B1* | 10/2001 | Abali | ..................... | H04B 3/542 340/12.34 |
| 2001/0048363 A1* | 12/2001 | Trosper | .............. | G06K 19/0723 340/571 |
| 2002/0161557 A1* | 10/2002 | Freed | ..................... | G08C 17/00 702/188 |
| 2005/0076254 A1* | 4/2005 | Robinson | .............. | G06F 1/3209 713/320 |
| 2005/0091413 A1* | 4/2005 | Walbeck | ................ | H04B 3/542 709/251 |
| 2006/0097753 A1* | 5/2006 | Shibata | ................ | G06F 1/3203 326/83 |
| 2007/0140199 A1* | 6/2007 | Zhao | ................ | H04W 52/0229 370/338 |
| 2014/0129859 A1* | 5/2014 | O'Malley | ............ | G06F 1/3209 713/323 |

* cited by examiner

*Primary Examiner* — Cassandra F Cox
(74) *Attorney, Agent, or Firm* — Michael A. Davis, Jr.; Charles A. Brill; Frank D. Cimino

(57) ABSTRACT

Described examples include an integrated circuit including a receive portion to receive an encoded transmission on a line. The receive portion has: a wake mode in which the receiver is capable of receiving the encoded transmission; and a sleep mode in which the receiver is not capable of receiving the encoded transmission. A wakeup controller monitors the line for a wakeup signal and provides a signal to the receive portion to cause the receive portion to enter the wake mode when the wakeup controller receives the wakeup signal.

19 Claims, 7 Drawing Sheets

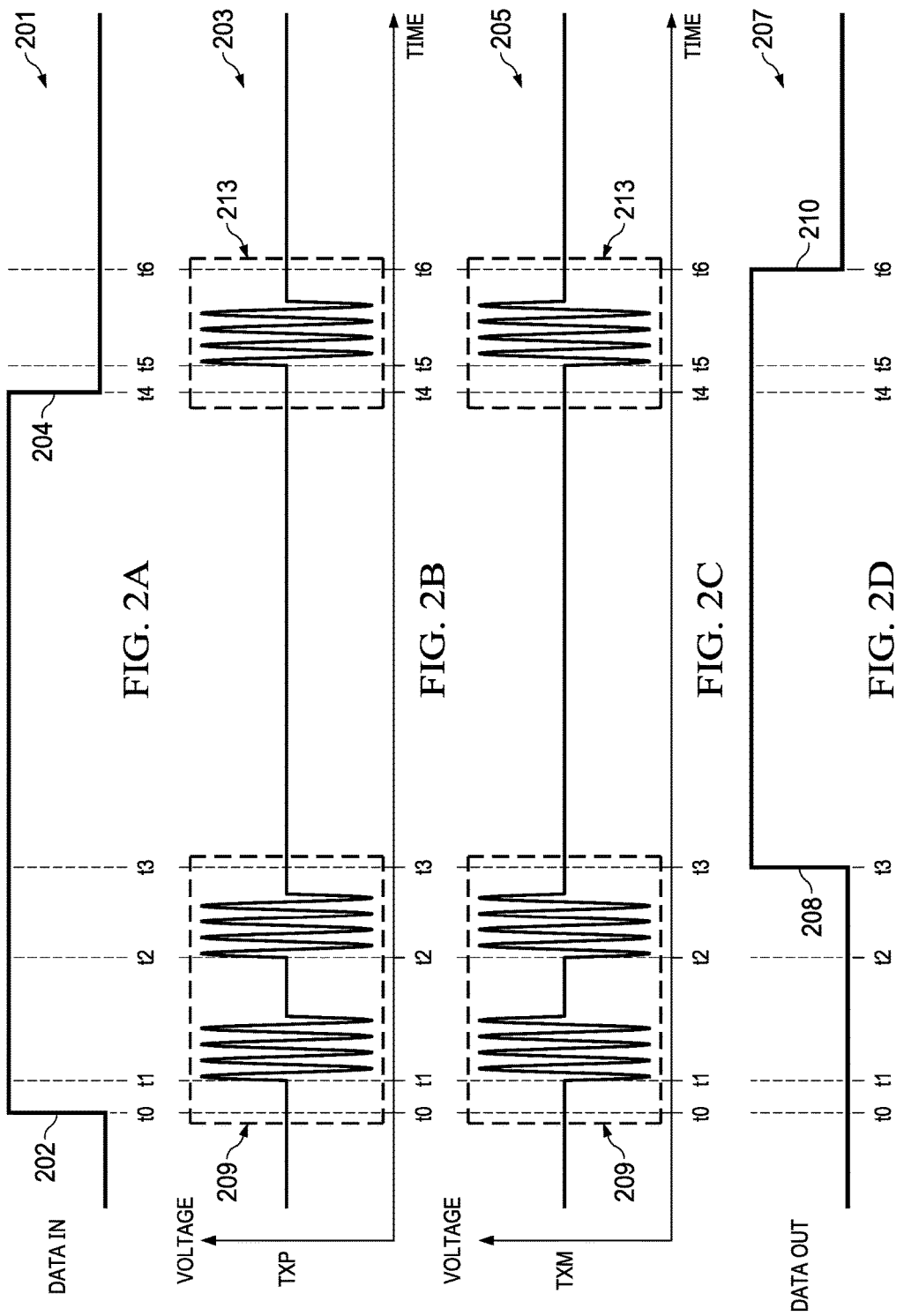

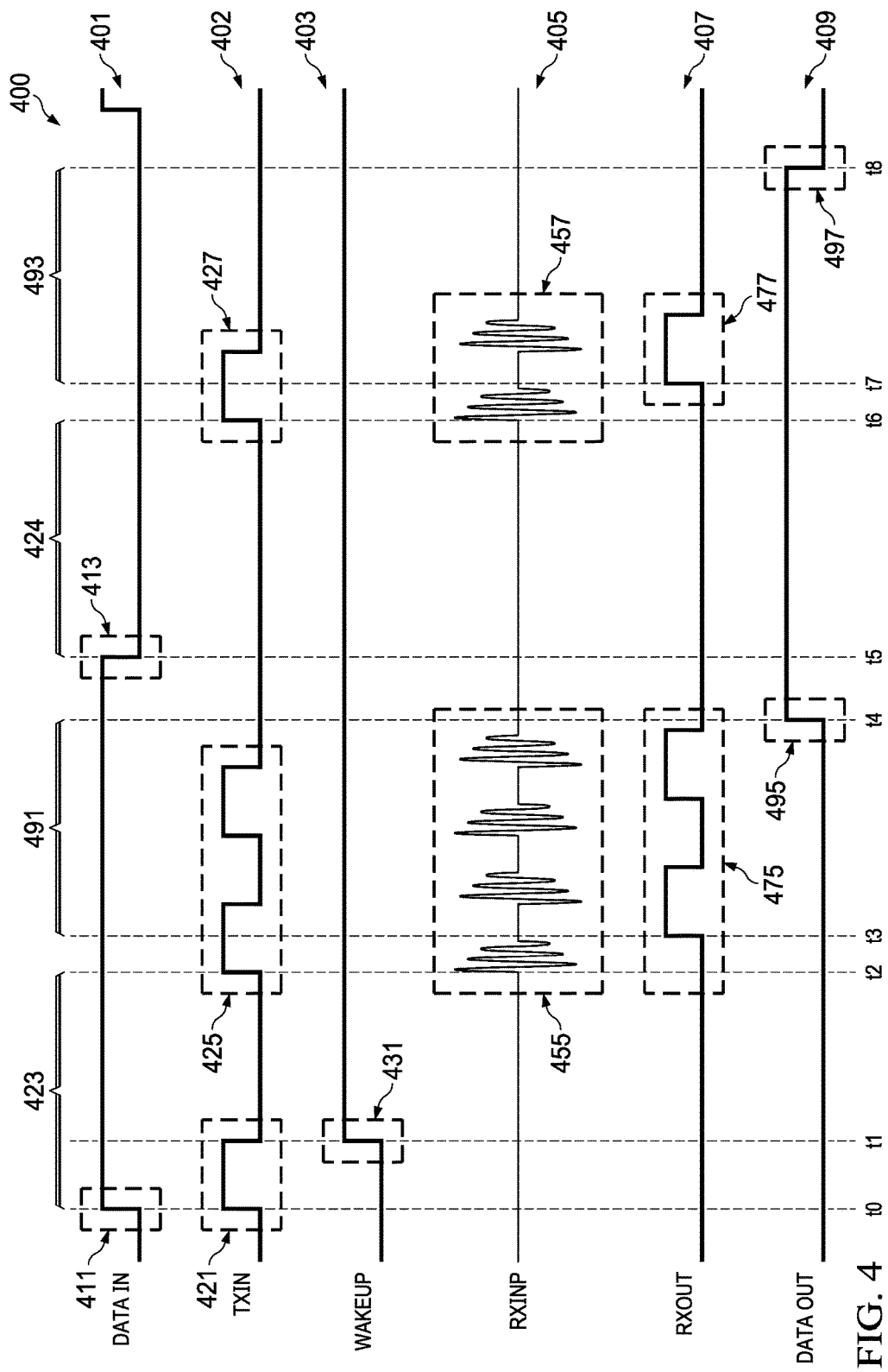

SIGNAL ISOLATION CIRCUIT

TECHNICAL FIELD

This relates generally to signal isolation circuits, and more particularly to isolation circuits for data transmission with common mode noise rejection.

BACKGROUND

Certain types of electronic systems include isolation circuits in their communications paths to achieve signal compatibility, provide protection from excessive voltage, and reduce signal noise. Industrial equipment and automotive electronics are two such systems. These systems often include a processor or controller that receives data from sensors and other circuits and sends data to control circuits and equipment such as motors and valves. Isolation circuits provide the communication paths between these components. Isolation circuits are useful to simplify system implementation where the circuits sending and receiving data use different power supplies. Isolation circuits typically include isolation barriers as part of the approach to reduce electrical interaction between the circuits sending and receiving data. These isolation barriers often include components, such as capacitors, transformers and optical devices. These components provide a path for signals to cross the isolation barrier without direct conductive coupling, such as with wires, circuit board traces, and integrated circuit metallic interconnect.

Isolation circuits often form a portion of the lowest layer in a so-called protocol stack. This lowest level is known as the physical layer. The lowest layer of the protocol stack typically provides the electronic path that transfers data bits (in the case of digital communications) from the input of the path to the output of the path. For digital communications, voltage levels or voltage transitions often represent data bits. Some systems employ current loops or other approaches to transfer data. Higher layers of the protocol stack may organize data bits into structures, such as packets and frames. Packets and frames may include header data bits, data payload bits, and error detection bits. Isolation circuits typically operate independently from the higher levels of the protocol stack, and thus transfer data bits regardless of the packet or frame structure and content. Communications in systems that do not use structures (such as packets and frames) can also use isolation circuits, which are further useful in systems that do not use protocol stacks.

SUMMARY

In an example, an integrated circuit includes a receive portion to receive an encoded transmission on a line. The receive portion has: a wake mode in which the receiver is capable of receiving the encoded transmission; and a sleep mode in which the receiver is not capable of receiving the encoded transmission. A wakeup controller monitors the line for a wakeup signal and provides a signal to the receive portion to cause the receive portion to enter the wake mode when the wakeup controller receives the wakeup signal.

BRIEF DESCRIPTION OF THE DRAWINGS

FIGS. 2A-2D (collectively "FIG. 2") are a set of signal traces and timing diagrams illustrating the operation of the example isolation circuit of FIG. 1

FIG. 4 is a group of timing diagrams and a waveform diagram illustrating signals on selected lines of the example of FIG. 3.

DETAILED DESCRIPTION OF EXAMPLE ARRANGEMENTS

Figure 1:
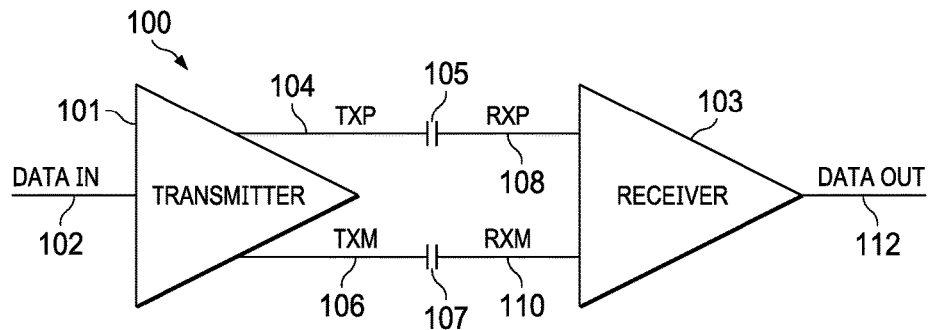
FIG. 1 is a block diagram of an example isolation circuit.

Corresponding numerals and symbols in the drawings generally refer to corresponding parts unless otherwise indicated. The drawings are not necessarily drawn to scale.

The term "coupled" may include connections made with intervening elements, and additional elements and various connections may exist between any elements that are "coupled." The term "line' is used herein to refer to connecting elements, such as metal interconnects on an integrated circuit and traces on a circuit board. A line coupled to two or more circuit elements may include intervening elements and additional elements that are not illustrated and not described herein. The incorporation of such intervening and additional elements is dependent upon a circuit implementation in a specific application. Examples of intervening and additional elements include buffers to increase signal drive strength and passive elements, such as resistors.

In the drawings, signal traces and timing diagrams (including groups of drawings with a same base number, such as FIGS. 5A-5E with the same base number of 5) are drawn with approximately the same time scales and are aligned vertically. Accordingly, approximately simultaneous states of signals in a drawing (or group of drawings with the same base number) are aligned vertically. The signal trace diagrams herein are drawn with representative and approximate waveform shapes. Signal delays through circuit elements are not illustrated, unless important to the description of circuit operation.

FIG. 1 is a block diagram of an example isolation circuit 100. Input line 102, labeled "DATA IN," couples to the input of transmitter 101. The differential outputs of transmitter 101 couple to lines 104 and 106, labeled TXP and TXM, respectively. The lines 104 and 106 also couple to capacitors 105 and 107, respectively. The opposing plates of capacitors 105 and 107 couple to the differential inputs of receiver 103 via lines 106 and 108, labeled RXP and RXM, respectively. Capacitors 105 and 107 are a portion of the isolation barrier between transmitter 101 and receiver 103. In other examples, the isolation barrier could be constructed using capacitors, transformers, optical-couplers or combinations thereof. The output of receiver 103 couples to the line 112 labeled "DATA OUT." The signals on the lines 102 and 112 are logic signals with "high" and "low" voltage levels in this example that represent binary values "1" and "0." The data input and data output signals of isolation circuits are often compatible with data transmission standards.

FIGS. 2A-2D (collectively "FIG. 2") are a set of signal traces and timing diagrams illustrating the operation of the example isolation circuit 100 of FIG. 1. Trace 201 of FIG. 2A, labeled "DATA IN," corresponds to the signal on the line 102 (FIG. 1). Trace 201 illustrates a low to high transition 202 followed by a high to low transition 204. Low to high transition 202 occurs at approximately time t0. High to low transition 204 occurs at approximately the time t4. Traces 203 and 205 of FIGS. 2B and 2C, respectively, labeled "TXP" and "TXM" in FIGS. 2B and 2C, correspond to the signals on the lines 104 and 106 (FIG. 1), respectively. Transmitter 101 (FIG. 1) encodes a rising edge on line 102 (FIG. 1) as two successive oscillation bursts (a "double burst") on lines 104 and 106 (FIG. 1). FIGS. 2B and 2C illustrate this double burst 209. The first burst of double burst 209 begins at approximately the time t1. The second burst of double burst 209 begins at approximately the time t2. Transmitter 101 (FIG. 1) encodes a falling edge of the signal on line 102 (FIG. 1) as one oscillation burst (a "single burst"). FIGS. 2B and 2C this single burst 213 at approximately the time t5. Double burst 209 and single burst 213 are example encoding schemes for isolation circuits. Isolation circuits also employ various other coding approaches for transitions such as those on line 102 (FIG. 1).

As described hereinabove, the output of transmitter 101 is differential. Therefore, the waveform of the signal on the line 106 (FIG. 1) is approximately the inversion of the signal on line 104 (FIG. 1). The oscillation bursts on lines 104 and 106 (FIG. 1) occur approximately simultaneously.

The term "burst" herein describes a brief oscillation where a signal that is normally at an approximately fixed quiescent voltage undergoes several voltage transitions both above and below the quiescent voltage. When the burst is complete, the voltage of the signal returns to the approximately quiescent level. The term burst is also used herein to describe approximately simultaneous bursts occurring on differential signals. For example, the single burst 213 includes the signals occurring on traces 203 and 205 of FIGS. 2B and 2C. The amounts of time over which single bursts and double bursts occur is less than the pulse width of the signal being encoded on by transmitter 101 (FIG. 1).

Capacitors 105 and 107 (FIG. 1) affect the oscillation bursts on lines 104 and 106 (FIG. 1) approximately equivalently. Thus, an oscillation burst on line 110 (FIG. 1) is approximately the inversion of an oscillation burst on line 108 (FIG. 1). The bursts on lines 108 and 110 (FIG. 1) occur approximately simultaneously. FIG. 2 does not illustrate the signals on the lines 108 and 110 (FIG. 1), and these are not further described herein for simplicity of explanation.

Receiver 103 (FIG. 1) combines the signals on lines 108 and 110 (FIG. 1) to reduce common mode noise. Receiver 103 also detects oscillation bursts on lines 108 and 110 (FIG. 1). When receiver 103 detects a double burst on the lines 108 and 110 (FIG. 1), receiver 103 outputs a high level on line 112 (FIG. 1). When receiver 103 detects a single burst on the lines 108 and 110 (FIG. 1), receiver 103 outputs a low level on the line 112 (FIG. 1). Trace 207 of FIG. 2D labeled "DATA OUT" corresponds to the signal on the line 112 (FIG. 1). Thus, rising edge 208 illustrated in trace 207 of FIG. 2D that occurs at approximately time t3 corresponds to the double burst 209. Also, falling edge 210 illustrated in trace 207 of FIG. 2D that occurs at approximately time t6 corresponds to the single burst 213. Therefore, isolation circuit 100 (FIG. 1) regenerates the logic level transitions received on the line 102 (FIG. 1) on line 112 (FIG. 1).

Isolation circuits often employ filtering at the receiver input to improve common mode noise reduction. This filtering can result in signal loss. To overcome this signal loss, isolation circuits may include a sensitive receiver circuit that consumes significant power. These receivers are often continuously operating during periods of time when no transitions are received on the line 102 (FIG. 1), resulting in high energy consumption.

Figure 3:
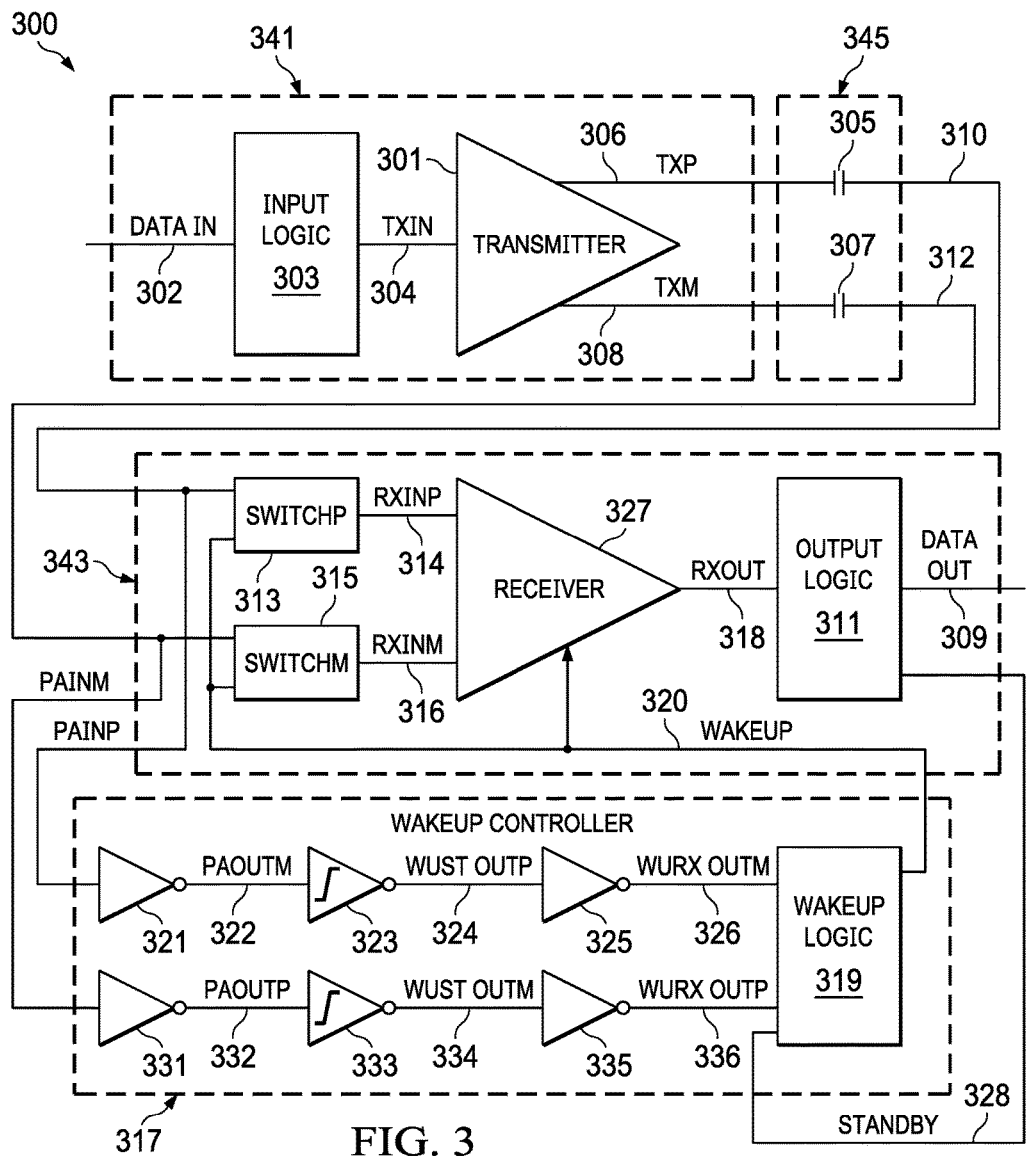
FIG. 3 is a block diagram of an example isolation circuit.

FIG. 3 is a block diagram of an example isolation circuit 300. In FIG. 3, line 302 labeled "DATA IN" couples to the data input of input logic circuit 303. Line 302 and line 309 labeled "DATA OUT" couple to circuits external to FIG. 3. Examples of these external circuits include microprocessors, analog front-ends for sensors, and the controllers for equipment such as valves and motors. The output of the input logic circuit 303 couples to line 304. Line 304 labeled "TXIN" couples to the input of the differential transmitter 301. The positive differential output of transmitter 301 couples to line 306 labeled "TXP". Line 306 also couples to one plate of capacitor 305. The opposite plate of capacitor 305 couples to the line 310. The negative differential output of transmitter 301 couples to line 308 labeled "TXM". Line 308 also couples to one plate of capacitor 307. The opposite plate of capacitor 307 couples to line 312. Thus, lines 306 and 308 are a differential pair that nonconductively couple to lines 310 and 312, respectively, which are also a differential pair. Capacitors 305 and 307 form part of the isolation element separating the transmit (TX) and receive (RX) functions. Other means, such as transformers and optical-couplers, could be used to provide the isolating functionality. Lines 310 and 312 couple to the signal inputs of the switches 313 and 315, respectively. In an example, transistors or other components implement these switches. The signal outputs of the switches 313 and 315 are couple to the lines 314 and 316, respectively. Lines 314 and 316 also couple to the positive and negative differential inputs of receiver 327, respectively. The output of receiver 327 couples to line 318. Line 318 also couples to the input of output logic circuit 311. The data output of the output logic circuit 311 couples to line 309 labeled "DATA OUT". The standby control output of output logic circuit 311 couples to line 328 labeled "STANDBY." Line 328 also couples to an input of wakeup logic circuit 319.

Lines 310 and 312 couple to the inputs of preamplifiers 321 and 331, respectively. The outputs of preamplifiers 321 and 331 couple to lines 322 and 332, respectively. Lines 322 and 332, labeled "PAOUTM" and "PAOUTP" also couple to the inputs of the Schmitt trigger circuits 323 and 333, respectively. The outputs of Schmitt trigger circuits 323 and 333 couple to lines 324 and 334, respectively. Lines 324 and 334, labeled "WUST OUTP" and WUST OUTM", also couple to the inputs of the buffers 325 and 335, respectively. The outputs of buffers 325 and 335 couple to lines 326 and 336, respectively. Lines 326 and 336, labeled "WURX OUTM" and "WURX OUTP", also couple to inputs of wakeup logic circuit 319. The output of wakeup logic circuit 319 couples to line 320. Line 320, labeled "WAKEUP," also couples to the enable input of receiver 327 and the control inputs of switches 313 and 315. Wakeup controller 317 includes preamplifiers 321 and 331, Schmitt trigger circuits 323 and 333, buffers 325 and 335, and wakeup logic circuit 319. Wakeup controller 317 monitors lines 310 and 312 for a wakeup signal, as further explained hereinbelow. Transmit portion 341 is the transmit portion of circuit 300. Receive portion 343 is the receive portion of circuit 300. Isolation capacitors 305 and 307 are in group 345. In an example, transmit portion 341 is an integrated circuit or hybrid package. In another example, receive portion 343 is an integrated circuit or hybrid package. In other examples, isolation capacitors group 345 is in a separate package or integrated with either the transmit portion 341 or receive portion 343, or both, either on an integrated circuit or in a hybrid package. Other examples could implement isolation using transformers or opto-couplers integrated as part of transmit or receive portions or both.

The example of FIG. 3 can be a portion of a communications path between two circuits external to circuit 300 of FIG. 3 such as a sensor in an industrial application and a microprocessor. Of the two external circuits coupled to circuit 300 of FIG. 3, the circuit sending data couples to line 302 "DATA IN" and the circuit receiving data couples to line 309 "DATA OUT." Bi-directional communication between the circuits external to FIG. 3 would employ two or more instantiations of the example arrangement. For example, a microprocessor may send data to a sensor to configure the sensor and control the communications protocol. Also in this example, the sensor sends measurement data (such as temperature) to the microprocessor. In this example, one instantiation of the example arrangement is used to send data from the microprocessor to the sensor, and a second instantiation of the example arrangement is used to send data from the sensor to the microprocessor. Additional instantiations of the example arrangement may be employed for separate control signals such as "request to send" and "clear to send" signals. The communication protocol often employs packets (and/or frames) as described hereinabove that can include data payload bits. An example of the data payload is a digital word corresponding to a temperature measurement. Communication protocols may include an "inter-packet time delay" between the end of one packet and the beginning of the next packet. The example of FIG. 3 functions independently of the packet content and structure provided enough time is ensured between the wakeup and the actual packet. Also, the example arrangement can be used in systems with different types of protocol stacks or systems that do not employ a protocol stack. Systems that do not employ packets, frames, or similar data structures can employ the example arrangement.

To reduce average power consumption, isolation circuit 300 enters a low power state (the "standby" state) when no transitions are on line 302 "DATA IN," such as during an inter-packet time delay or time-out. Isolation circuit 300 may further reduce average power consumption by entering the standby state more often such as between every transition on line 302. When isolation circuit 300 is in the standby state, it returns to normal higher power operation upon receiving the next transition on line 302. To accomplish the functionality of transitioning to the standby state, output logic circuit 311 (labeled "OUTPUT LOGIC" in FIG. 3) includes time-out circuits (not shown). Alternative example arrangements can be implemented without time-out circuits. In at least one example, wake up logic circuit 319 (labeled "WAKEUP LOGIC" in FIG. 3) provides a signal to enter the standby state after each transition on line 302.

The time-out circuits place isolation circuit 300 in the standby state when isolation circuit 300 does not receive any transitions on line 302 for approximately an amount of time referred to herein as the "time-out period." In at least one example implementation of isolation circuit 300, the time-out period is less than the inter-packet time delay of the communications protocol. Thus, isolation circuit 300 enters the standby state between packets as well as during other longer periods of time when isolation circuit 300 does not receive data to transfer. In an additional example, isolation circuit 300 is implemented to enter the standby state independent of the inter-packet time delay and when a system is implemented without an inter-packet time delay.

Recovery from error conditions is enabled by the time-out and standby functionality of the example arrangement. Many communication protocols recover from error conditions by retransmitting data packets or ignoring a packet with an error and waiting for a new packet. With such error recovery approaches, an inter-packet time delay typically occurs prior to this retransmission or transmission of a new packet. Thus, with the time-out period being less than the inter-packet time delay as described hereinabove, isolation circuit 300 will enter the standby state following a protocol error. Example arrangements that enter the standby state between each transition on line 302 will also enter the standby state during the inter-packet time delay following a protocol error. When in the standby state, isolation circuit 300 responds to the next transition on line 302 and regenerates a corresponding edge on line 309. Thus, the system error recovery functionality operates as intended. The example arrangements described herein do not detect errors and do not resolve errors that are often the functions of higher level protocols.

In some example arrangements, employing time-out circuits, the time-out period is fixed and cannot be changed. In other example arrangements, the time-out period is modifiable. Examples include setting the time-out period to a fixed value when a system is manufactured or modifying the time-out period during system operation.

Example external circuits coupled to lines 302 and 309 include various coding approaches for serial data bits such as Manchester coding, bipolar coding, unipolar coding, return to zero, and non-return to zero (NRZ) coding or combinations thereof. Alternative example arrangements can be implemented that function as intended with one or more coding approach. Isolation circuit 300 as described herein is based on coding where the voltage on lines 302 and 309 is approximately zero for a low logic state, and a positive voltage for a high logic state. For coding approaches employing a voltage range that is different than the voltage range of a specific implementation of the example arrangement, additional circuits (not shown) can be included in an alternative example arrangement or in a system that modifies the voltage range on lines 302 and 309.

The example arrangements described herein regenerate logic level transitions (or edges) received on line 302 on line 309. The regenerated edges on line 309 have the same direction (high to low and low to high) as corresponding edges received on line 302. The regenerated edges also have approximately the same time separation between edges as the corresponding received edges. Thus, the example arrangement will function as intended with various coding approaches. Alternative example arrangements regenerate the data received on line 302, such that the coding is different on line 309.

Some coding approaches employ more than two voltage states. An example coding approach employs three voltage states, which are: a high-level voltage, a low-level voltage, and an intermediate voltage. Some coding approaches use the intermediate voltage as an idle state. Some coding approaches return to the intermediate voltage for a short period of time during transitions between the low-level and high-level voltages. To operate with such coding approaches additional circuits are included in a system or within an alternative example arrangement that performs coding conversion. For systems that employ current loops, external circuits or additional circuits within an alternative example arrangement are employed, such that the isolation circuit operates as intended with current loops.

FIG. 4 is a group of timing diagrams and a waveform diagrams 400. FIGS. 5A-5E (collectively "FIG. 5") are waveform diagrams. The timing and waveform diagrams of FIGS. 4 and 5 illustrate signals on selected lines of the example of FIG. 3 in operation. The timing and waveform diagrams of FIGS. 4 and 5 are described hereinbelow.

In operation, the example isolation circuit 300 (FIG. 3) functions as described hereinbelow. When isolation circuit 300 is in the standby state, the signal on line 320 ("WAKEUP") (FIG. 3) is low. The low signal on line 320 (FIG. 3) disables receiver 327 and opens switches 313 and 315 (FIG. 3) ("sleep mode").

Figure 5A:
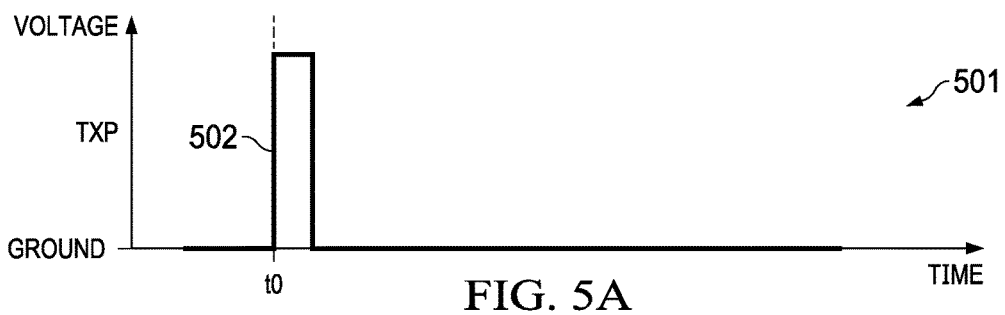
FIGS. 5A-5E (collectively "FIG. 5") are waveform diagrams illustrating signals on selected lines of the example of FIG. 3.
Figure 5B:
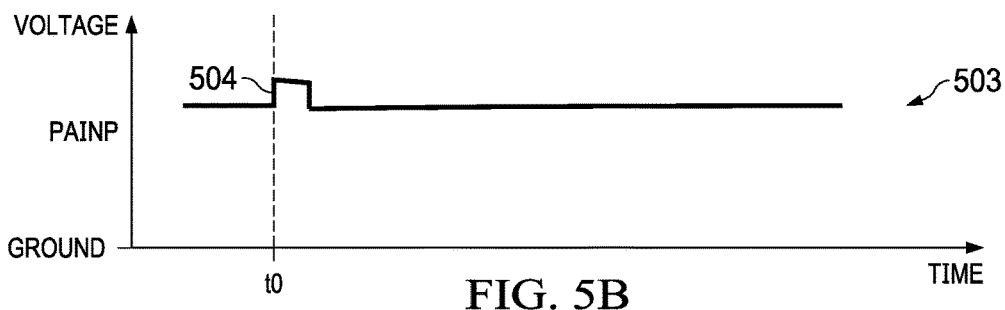
Figure 5C:
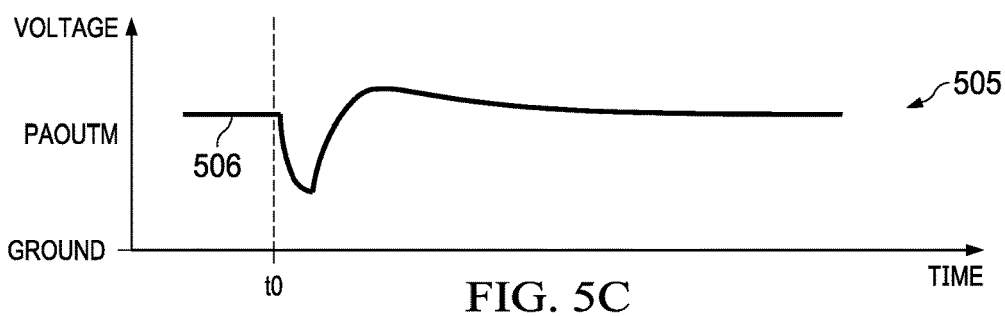
Figure 5D:
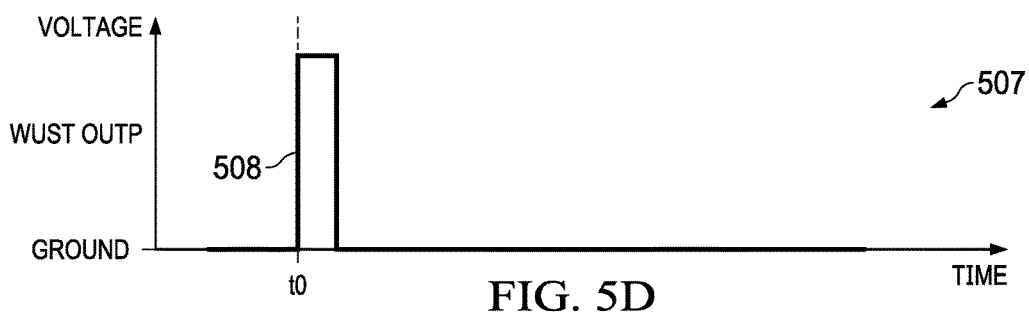
Figure 5E:
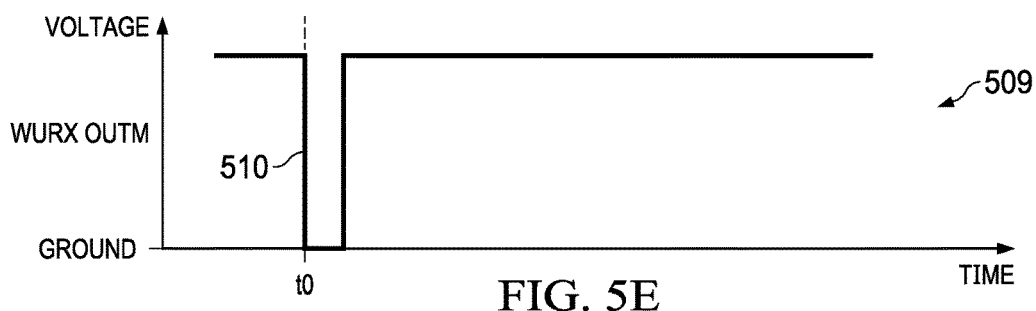

Trace 401 ("DATA IN") corresponds to the signal on line 302 (FIG. 3). Event 411 on trace 401 corresponds to a transition on line 302 (FIG. 3) occurring at approximately time t0. Isolation circuit 300 (FIG. 3) is in the standby state when this transition occurs. When event 411 occurs, the input logic circuit 303 (FIG. 3) generates a wakeup pulse 421 beginning at approximately at time t0. (Delays through the input logic circuit 303 are not described herein for simplicity of explanation.) Trace 402 is the signal labeled "TXIN" and corresponds to the signal on line 304 (FIG. 3). Transmitter 301 (FIG. 3) generates differential pulses in response to this wakeup pulse approximately simultaneously on lines 306 and 308 (FIG. 3). FIG. 5A illustrates a pulse 502 on trace 501 as an example of the pulse on line 306 (FIG. 3). The pulse on line 308 (FIG. 3) is the opposite polarity of pulse 502. The pulse on line 308 is not illustrated for simplicity of explanation. As with differential signaling, the signal on line 308 is approximately the inversion of the signal on line 306 occurring at approximately the same time. Only one of the differential paths from the output of transmitter 301 (FIG. 3) to inputs of receiver 327 (FIG. 3) and to the inputs of the wakeup logic circuit 319 (FIG. 3) is described in detail herein for simplicity of explanation. As with differential circuits and signaling, both differential paths behave similarly with inverted voltages and approximately the same timing.

In response to pulse 502, the impedance of capacitor 305 in combination with the input impedance of preamplifier 321 (FIG. 3) results in pulse 504 illustrated on trace 503. Trace 503, labeled "PAINP", corresponds to the signal on line 310 (FIG. 3). Switch 313 (FIG. 3) is open, as described hereinabove. Therefore, the input impedance of receiver 327 (FIG. 3) does not affect the signal on line 310 (FIG. 3). In the example of FIG. 3 the preamplifiers 321 and 331 of FIG. 3 are current-starved, inverting amplifiers that consume low power when idle (in other examples, other types of amplifiers can be used). In response to pulse 504, preamplifier 321 generates pulse 506 on trace 505. Trace 505, labeled "PAOUTM", corresponds to the signal on line 322 (FIG. 3). Schmitt trigger circuit 323 (FIG. 3) generates pulse 508 in response to pulse 506. Trace 507 corresponds to the signal on line 324 (FIG. 3). Buffer 325 (FIG. 3) inverts the signal on line 324 generating pulse 510 on trace 509. Trace 509, labeled "WURX OUTM" in FIG. 5, corresponds to the signal on line 326 (FIG. 3). The illustrated waveforms are approximate representations of signals on the various lines of FIG. 3 as described hereinabove, but (for specific implementations of the example arrangements) waveforms of signals on lines 310 and 312 may differ significantly from the illustrations of FIGS. 5B and 5C. The initial transitions of the signals represented in FIG. 5 are illustrated occurring at the time labeled t0 in FIG. 5. Delays through circuit elements of FIG. 3 would result in the initial transitions of the signals illustrated in FIGS. 5B-E occurring after time t0 of FIG. 5. Such delays are dependent on an implementation of the example arrangement in a specific application and are not described herein for simplicity of explanation.

Because the circuits in the paths from transmitter 301 (FIG. 3) that generate the signals on lines 326 and 336 (FIG. 3) are differential as described hereinabove, buffer 335 (FIG. 3) generates a pulse on line 336 that is approximately equivalent to the inversion of the pulse 510. These two pulses on these lines occur approximately simultaneously.

In response to pulse 510 on 509 WURX OUTM, and approximately simultaneously with inverted pulse on line 336 (FIG. 3), the wakeup logic circuit 319 (FIG. 3) outputs a rising edge on line 320 (FIG. 3). FIG. 4 illustrates this rising edge 431 on line 320 (FIG. 3). Rising edge 431 occurs at approximately time t1 (FIG. 4). The signal on line 320 (FIG. 3) corresponds to trace 403 (labeled "WAKEUP" in FIG. 4). When the signal on line 320 is a high level, switches 313 and 315 (FIG. 3) are closed and receiver 327 (FIG. 3) is enabled ("wake mode"). Based on the hereinabove described functionality of isolation circuit 300 (FIG. 3), the rising edge 431 on line 320 (FIG. 3) is in response to pulse 502 on line 302 (FIG. 3), which FIG. 4 illustrates as pulse 421 of trace 402.

Also, to generate the wakeup pulse as described hereinabove, the input logic circuit 303 (FIG. 3) encodes rising and falling edges received on line 302 (FIG. 3) to provide an encoded transmission. Rising edges on line 302 (FIG. 3) are encoded with two pulses on line 304 (FIG. 3). Falling edges on line 302 (FIG. 3) are encoded with one pulse on line 304 (FIG. 3). For example, two pulses 425 encode a rising edge as event 411 of trace 401 (labeled DATA IN in FIG. 4) received on the line 302 (FIG. 3). Pulses 425 begin at approximately time t2 (FIG. 4). Input logic circuit 303 applies a delay 423 to these two pulses 425 from the corresponding event 411 on line 302 (FIG. 3). Delay 423 is approximately the difference between times t0 and t2 (FIG. 4). Trace 402 (TXIN in FIG. 4) illustrates an example of single pulse event 427 that encodes falling edge 413 of trace 401 (FIG. 4) received on line 302 (FIG. 3). Falling edge 413 occurs at approximately time t5 (FIG. 4). Single pulse event 427 occurs at approximately time t6 (FIG. 4). The leading edge of single pulse event 427 is delayed from the corresponding falling edge 413 on line 302 (FIG. 3). An example of this delay is delay 424 (FIG. 4). Delay 424 is approximately the difference between times t5 and t6 (FIG. 4). Delays 423 and 424 are termed the "encoding delay" herein.

A wakeup pulse is not generated on the signal on trace 402 (TXIN in FIG. 4) resulting from falling edge 413 (on trace 401, DATA IN in FIG. 4). However, alternative example arrangements that enter the standby state between every transition on line 302 (FIG. 3) will generate a wakeup pulse for all transitions on trace 401 including falling edge 413. For such alternative example arrangements, the wakeup pulses on trace 402 occur approximately immediately following the corresponding transition on trace 401. For example, a wakeup pulse occurring on trace 401 because of falling edge 413 (FIG. 4) would occur at approximately time t5 (FIG. 4).

The encoding delays described hereinabove following both rising and falling edges on line 302 (FIG. 3) have constraints. For a case of a wakeup pulse 421 (on trace 402 TXIN in FIG. 4), the encoding delay 423 (FIG. 4) must be sufficient for switches 313 and 315 (FIG. 3) to close and for receiver 327 (FIG. 3) to be enabled before the end of the encoding delay 423 (approximately time t2). For cases where the wakeup pulse is not generated following a transition on line 302 (FIG. 3), the example arrangement can be implemented for the encoding delay to be approximately equivalent to the encoding delay for cases when a wakeup pulse is generated. Accordingly, the delay 424 (FIG. 4) can be approximately equivalent to delay 423 (FIG. 4).

In the example of FIG. 3, the input impedances of receiver 327 (FIG. 3) that couple to lines 314 and 316 (FIG. 3) are inductive. When switch 313 (FIG. 3) closes, capacitor 305

(FIG. 3) and the inductive input impedance of receiver 327 couple to line 314 and form a high-pass filter. Similarly, when switch 315 (FIG. 3) closes, capacitor 307 (FIG. 3) and the inductive input impedance of receiver 327 couple to line 316 (FIG. 3) and form a high-pass filter. Thus, when transmitter 301 (FIG. 3) generates voltage transitions on the lines 306 and 308 (FIG. 3), the signals at the inputs of receiver 327 (FIG. 3) coupled to lines 314 and 316 (FIG. 3) are decaying oscillations (or ringing). For example, in response to the four edges of pulses 425 (on trace 402 TXIN in FIG. 4), transmitter 301 (FIG. 3) generates four corresponding voltage transitions on its differential outputs coupled to lines 306 and 308 (FIG. 3). Because of these voltage transitions on the lines 306 and 308, ringing bursts occur on the differential inputs of receiver 327, which couple to the lines 314 and 316 (FIG. 3). In this example, event 455 (on trace 405 labeled RXINP in FIG. 4) illustrates the four ringing bursts at the inputs of receiver 327. Trace 405 (FIG. 4) corresponds to the signal on line 314 (FIG. 3). Approximately simultaneous to the occurrence of the ringing bursts of event 455 (FIG. 4), four ringing bursts occur on the line 316 (FIG. 3). The ringing bursts on line 316 are inverted with respect to event 455 (FIG. 4) on line 314 (FIG. 3). The signal on line 316 (FIG. 3) is not illustrated herein for simplicity of explanation. Event 427 of trace 402 (labeled TXIN in FIG. 4) and event 457 of trace 405 (FIG. 4) illustrate a similar example (not described herein for simplicity of explanation) for a single pulse occurring on line 304 (FIG. 3).

Receiver 327 (FIG. 3) combines the signals received on its differential inputs coupled to lines 314 and 316 (FIG. 3). Combining these signals differentially significantly reduces common mode voltage transients (this functionality is known as common mode transient immunity (CMTI)). Receiver 327 also performs a function such as envelope detection to identify a ringing burst. Receiver 327 inverts the output voltage on line 318 (FIG. 3) when it detects a ringing burst. For example, the ringing bursts illustrated in events 455 and 457 (on trace 405 RXINP in FIG. 4) result in the voltage transitions illustrated in events 475 and 477, respectively, of trace 407 (labeled "RXOUT" in FIG. 4). Events 475 and 477 begin at approximately times t3 and t7, respectively. Trace 407 (FIG. 4) corresponds to the signal on line 318 (FIG. 3). In this example, the pulses of the events 475 and 477 are the regenerated pulses 425 and 427, respectively. Receiver 327 (FIG. 3) generates a transition on the line 318 (FIG. 3) following the detection of a ringing burst. For example, the first ringing burst of event 455 is approximately complete at time t3 (FIG. 4). Also at approximately time t3, receiver 327 generates a transition on line 318 (FIG. 3) as illustrated in trace 407 (RXOUT in FIG. 4). For an implementation of the example arrangement in a specific application, the receiver may detect a ringing burst before the ringing burst is complete.

Output logic circuit 311 (FIG. 3) outputs a logic high on line 309 (FIG. 3) when it receives a group of two pulses on line 318 (FIG. 3). Output logic circuit 311 outputs a logic low on the line 309 (FIG. 3) when it receives a single pulse on the line 318 (FIG. 3). The signal on line 309 (FIG. 3) corresponds to the signal labeled "DATA OUT" in trace 409 (FIG. 4). The two pulses of event 475 in trace 407 (RXOUT in FIG. 4) result in the output logic circuit 311 generating the rising edge labeled as event 495 in trace 409 (DATA OUT in FIG. 4). Event 495 occurs at approximately time t4 (FIG. 4). The single pulse of event 477 in trace 407 (FIG. 4) results in output logic circuit 311 generating the falling edge labeled as event 497 in trace 409 (FIG. 4). Event 497 occurs at approximately time t8 (FIG. 4). The sequence of transitions illustrated in trace 409 (DATA OUT in FIG. 4) (corresponding to the signal on line 309 (FIG. 3)) is the regenerated sequence of transitions illustrated in trace 401 (DATA IN in FIG. 4) (corresponding to the signal on line 302 (FIG. 3)).

To differentiate between a single pulse (such as event 477 of trace 407 RXOUT in FIG. 4) and one pulse within a group of two pulses (such as the first pulse in event 475 of trace 407 (RXOUT in FIG. 4)), output logic circuit 311 employs an approximate "maximum time limit" for a group of two pulses. Two examples of this maximum time limit correspond to time periods 491 and 493 (FIG. 4). The maximum time limit begins when a rising edge occurs on line 318 (trace 407 (FIG. 4)) following a period of inactivity on this signal. Thus, the maximum time limits of time periods 491 and 493 begin at times t3 and t7, respectively. The period of inactivity depends on the implementation of the example arrangement in a specific application. Two pulses occurring within the maximum time limit indicate that a rising edge is to be output on line 309 (FIG. 3). A single pulse occurring within the maximum time limit indicates that a low level is to be output on line 309 (FIG. 3). For example, only one pulse occurs on line 318 (trace 407 RXOUT in FIG. 4)) within the time period 493 (FIG. 4). Thus, the output logic circuit 311 (FIG. 3) outputs a low level on line 309 (FIG. 3) corresponding to event 497 on trace 409 (DATA OUT in FIG. 4).

When the input logic circuit 303 (FIG. 3) does not receive a transition on line 302 (FIG. 3), for a time greater than the time-out period (described hereinabove), the input logic circuit 303 enters the standby state. For an alternative example arrangement implemented without a time-out circuit, the input logic circuit 303 (FIG. 3) enters the standby state approximately immediately after completing the encoding of the most recent transition on line 302 (FIG. 3). For such an alternative example arrangement, the input logic circuit 303 enters the standby state upon completion of pulses 425 on line 304 (trace 402 TXIN in FIG. 4)), such as approximately time t4. This event illustrates the encoding of the transition on line 302 (FIG. 3) illustrated as event 411 of trace 401 (FIG. 4). For example, arrangements implemented with or without time-out circuits, when in the standby state, the input logic circuit 303 exits the standby state and generates a wakeup pulse on line 304 (FIG. 3) when input logic circuit 303 receives the next transition on line 302 (FIG. 3) as described hereinabove.

When the output logic circuit 311 (FIG. 3) does not receive a pulse on line 318 (FIG. 3) for a time greater than the time-out period (described hereinabove), the output logic circuit 311 outputs a pulse on line 328 (FIG. 3). For an alternative example arrangement implemented without a time-out circuit, the output logic circuit 311 (FIG. 3) outputs a pulse on line 328 approximately immediately after generating a transition on line 309 (FIG. 3), such as at time t4 (FIG. 4). For example arrangements implemented with or without time-out circuits, in response to receiving a pulse on line 328 (FIG. 3), the wakeup logic circuit 319 outputs a low level on line 320 (FIG. 3). When the voltage on line 320 transitions to a low level, receiver 327 is disabled and switches 313 and 315 open. When disabled ("sleep mode"), receiver 327 is in a low power consumption state. When the input logic circuit 303 (FIG. 3) generates the next wakeup pulse on line 304 in response to the next transition on line 302, the functionality of isolation circuit 300 (FIG. 3) described hereinabove repeats.

In another example arrangement, the circuits of wakeup controller 317 enter a low power state while the signal on line 320 (WAKEUP in FIG. 3) is high. For such an example arrangement, a portion of the wakeup logic circuit 319 remains active to maintain a high level on line 320 and to respond to a signal on line 328 (FIG. 3).

The time-out periods employed by the output logic circuit 311 (FIG. 3) and the input logic circuit 303 (FIG. 3) can be approximately equivalent or differ depending on the characteristics of a specific implementation of the example arrangement. For another example arrangement implemented with or without time-out circuits, the wakeup logic circuit 319 (FIG. 3) includes circuitry (not shown) to prevent a "dead lock" condition. An example dead lock condition may occur when the input logic circuit 303 generates a wakeup pulse prior to the output logic circuit 311 generating a pulse on line 328. Potential dead lock conditions and approaches to prevent dead lock conditions depend on an implementation of the example arrangement in a specific application.

The example arrangement can operate with low average power consumption using a receiver 327 (FIG. 3) that consumes high power by placing receiver 327 in a low power state when transitions are not occurring on line 302 as described hereinabove. The example configuration of receiver 327 consumes low power when disabled. Such a receiver that consumes high power when enabled, but can include highly sensitive detection circuity and highly effective CMTI circuitry. Thus, an example arrangement can achieve a low data error rate and low average power consumption. For example, where the data rate on line 302 (FIG. 3) is approximately 1,000,000 bits per second, the data pulse width is approximately one microsecond for some coding approaches. For an example arrangement implemented with a "regeneration delay" of approximately 100 nanoseconds, in this example, receiver 327 can be disabled approximately 90% of the time. Thus, the average power is reduced compared to an isolation circuit with a high-power receiver operating continuously. The regeneration delay is the time between receiving a transition on line 302 (FIG. 3) and outputting the corresponding regenerated transition on line 309 (FIG. 3). In many applications, the data rate on line 302 is significantly less than 1,000,000 bits per second with data pulse widths significantly greater than one microsecond. For these longer pulse widths, receiver 327 can be disabled more than 90% of the time for additional power savings. Also, for communications where data is sent in bursts (such as packets or frames) with delays between bursts, receiver 327 can remain in the low power state for a higher percentage of the time for some data coding approaches. Also, for data coding approaches where transitions do not occur on line 302 for a series of equivalent bits (such as a series of "1" bits), the receiver can remain in the low power state for a higher percentage of the time.

Figure 6:
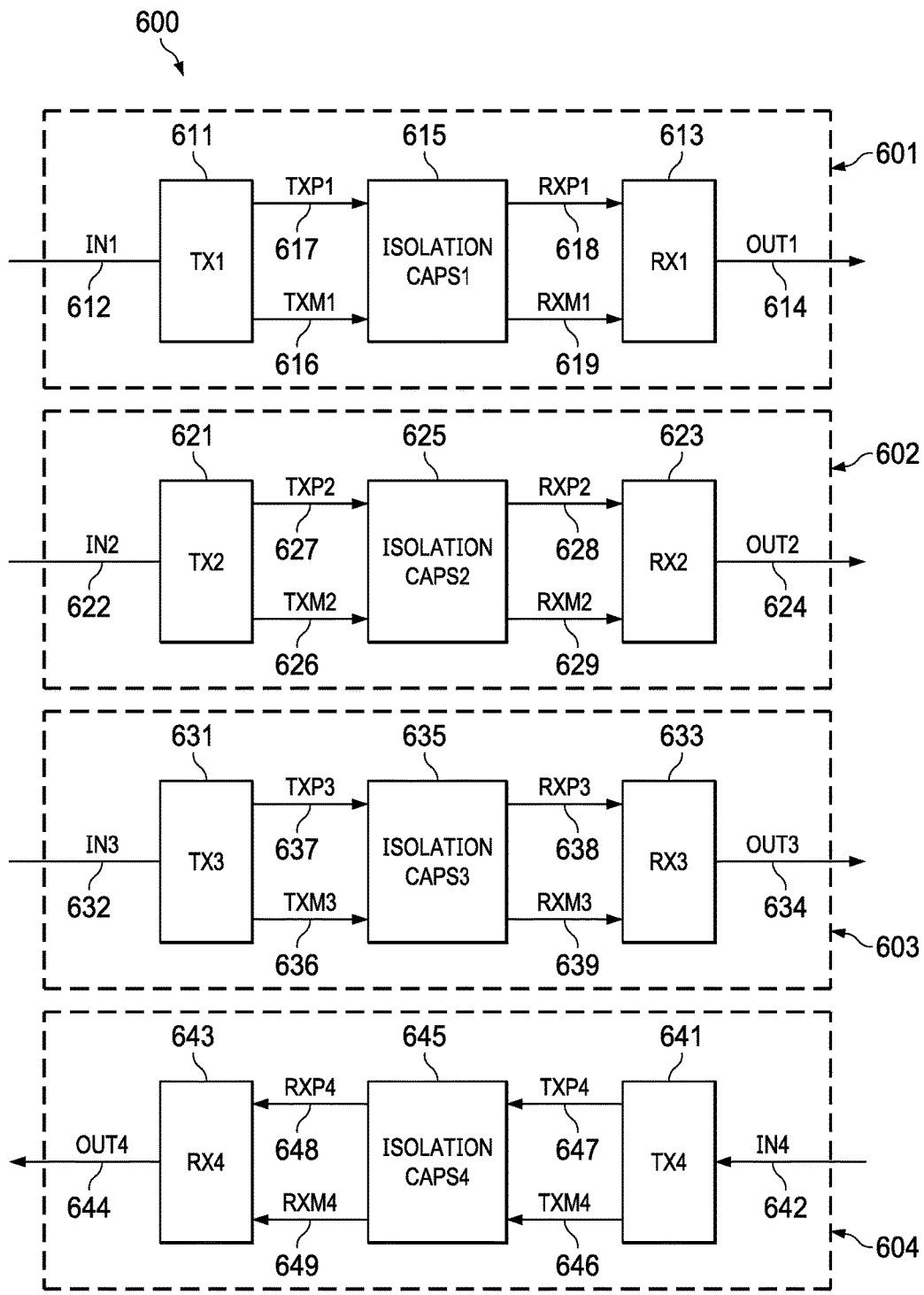
FIG. 6 is a block diagram of a circuit that includes four instantiations of an example isolation circuit.

FIG. 6 is a block diagram of circuit 600 that includes four instantiations of an example isolation circuit. In an example implementation, the circuit 600 is a single integrated circuit. In additional example implementations, the circuit 600 includes multiple integrated circuits and/or discrete components on a board or a module. Multiple integrated circuits can be packaged in a single unit, such as stacked die packages or multichip modules, for ease of use and to further increase integration. For example, receive circuits 613, 623, 633 (labeled "RX1", "RX2", and "RX3" in FIG. 6) and transmit circuit 641 (labeled "TX4 in FIG. 6) may be in one integrated circuit or hybrid package and transmit circuits 611, 621 and 631 (labeled "TX1", "TX2" and "TX3" in FIG. 6) and receive circuit 643 (labeled "RX4 in FIG. 6) may be in another integrated circuit or hybrid package. Example implementations of circuit 600 include user defined semi-custom integrated circuits including field programmable gate arrays (FPGAs), complex programmable logic devices (CPLDs), and application-specific integrated circuits (ASIC). Custom integrated circuits can also be used.

Circuit 600 employs circuits corresponding to those illustrated in FIG. 3 as described hereinbelow. The isolation circuits 601, 602, 603, and 604 correspond to four instantiations of circuit 300 of FIG. 3. Transmit circuits 611, 621, 631 and 641 correspond to four instantiations transmit portion 341 (FIG. 3). Receive circuits 613, 623, 633 and 643 correspond to four instantiations of receive portion 343 (FIG. 3). Isolation caps 615, 625, 635 and 645 (labeled "ISOLATION CAPS1", "ISOLATION CAPS2", "ISOLATION CAPS3" and "ISOLATION CAPS4" in FIG. 6) correspond to four instantiations of isolation capacitor group 345 (FIG. 3). Outputs of transmit circuits 611, 621, 631 and 641 couple to lines 616, 626, 636 and 646, respectively. These lines correspond to line 306 (FIG. 3). Other outputs of transmit circuits 611, 621, 631 and 641 couple to lines 617, 627, 637 and 647, respectively. These lines correspond to line 308 (FIG. 3). Lines 616, 626, 636 and 646 also couple to isolation caps 615, 625, 635 and 645, respectively. Lines 617, 627, 637 and 647 couple to other inputs of isolation caps 615, 625, 635 and 645, respectively. Outputs of isolation caps 615, 625, 635 and 645 couple to lines 618, 628, 638 and 648, respectively. These lines correspond to line 310 (FIG. 3). Other outputs of isolation caps 615, 625, 635 and 645 couple to lines 619, 629, 639 and 649, respectively. These lines correspond to line 312 (FIG. 3). The lines 618, 628, 638 and 648 also couple to inputs of receive circuits 613, 623, 633 and 643, respectively. Lines 619, 629, 639 and 649 also couple to other inputs of receive circuits 613, 623, 633 and 643, respectively. Inputs of transmit circuits 611, 621, 631, and 641 couple to lines labeled 612, 622, 632 and 642, respectively. These lines are also external inputs to the circuit 600 of FIG. 6 and correspond to line 302 (FIG. 3). Outputs of receive circuits 613, 623, 633, and 643 couple to lines 614, 624, 634, and 644, respectively. These lines are also external outputs (labeled "OUT1", "OUT2", OUT3" and "OUT4") of circuit 600 of FIG. 6 and correspond to line 309 (FIG. 3).

Circuit 600 of FIG. 6 is a four-channel isolation circuit with 3 channels in one direction and one channel in the opposite direction. Isolation circuits 601, 602 and 603 form three channels in one direction. Isolation circuit 604 forms the one channel in the opposite direction. The transmit circuits of these four channels are transmit circuits 611, 621, 631 and 641, respectively. The receive circuits of these channels are receive circuits 613, 623, 633 and 643, respectively. In the example of FIG. 6, the directionality of channels is based on various aspects of the implementation of circuit 600. Such implementation aspects include the physical structure of the integrated circuit and the power sources for the transmit and receive circuits. The transmit circuits 611, 621 and 631, and the receive circuit 643, receive power from one power source and are physically on one side of the integrated circuit, circuit package or in different containers. The receive circuits 613, 623 and 633, and the transmit circuit 641, receive power from a second power source and are on the opposite side of the integrated circuit, circuit package or in different containers. In an example system employing circuit 600 of FIG. 6, these two power sources are provided by separate power supplies. In the example of FIG. 6, the two sides of the circuit are separated by an insulator that also forms the dielectric gaps between plates of the capacitors internal to isolation caps 615, 625, 635 and 645. The capacitors in these circuits correspond to four instantiations of the capacitors 305 and 307 (FIG. 3). Other approaches can be used to isolate receive circuits from transmit circuits, such as implementing receive circuits and transmit circuits in different integrated circuits with the capacitors corresponding to 305 and 307 (FIG. 3) external to these integrated circuits. Alternate approaches could use transformers or optical couplers instead of isolation capacitors.

In operation of circuit 600 of FIG. 6, the groups of circuits 601, 602, 603, and 604 function similarly to circuit 300 of FIG. 3 as described hereinabove. Additional circuits to those illustrated in FIG. 6 may exist in circuit 600 of FIG. 6 for specific applications. Such circuits include power management, enable, and reset circuits. Circuit 600 can also be implemented with additional circuits that modify signals on one or more of the input lines (IN1, IN2, IN3, and IN4 in FIG. 6) and one or more of the output lines (OUT1, OUT2, OUT3, and OUT4 in FIG. 6). This signal modification can include voltage translation.

Alternative example arrangements include circuits or components that differ from those described hereinabove. Alternative example arrangements employ various approaches for enabling and disabling the receiver 327 (FIG. 3) between full power and low power states based on activity of the data signal on line 302 (FIG. 3). As shown in FIG. 3, alternative example arrangements include different implementations for the wakeup controller 317 (FIG. 3) to convert signals on lines 310 and 312 (FIG. 3) to the input signals for wakeup logic circuit 319 (FIG. 3).

Another alternative example includes a different circuit arrangement for the input logic circuit 303 (FIG. 3) to signal wakeup logic circuit 319 (FIG. 3) to enable receiver 327 (FIG. 3). One such alternative circuit arrangement includes a second isolated path coupling input logic circuit 303 (FIG. 3) to wakeup logic circuit 319 (FIG. 3). This alternative arrangement excludes switches 313 and 315 (FIG. 3) along with other corresponding changes to circuit 300. Also, in this alternative example arrangement, the input logic circuit 303, using the additional isolated path, signals the wakeup logic circuit 319 to disable receiver 327 (FIG. 3). Thus, output logic circuit 311 (FIG. 3) does not provide the functionality that determines when to disable receiver 327 (FIG. 3).

As described hereinabove, input logic circuit 303 encodes transitions on line 302 with pulses on line 304 (FIG. 3) and transmitter 301 converts the leading and trailing edges of these pulses to oscillations on lines 306 and 308 (FIG. 3). Alternative example arrangements include other approaches to communicate the occurrence and direction of transitions on line 302 to receive portion 343 (FIG. 3).

An alternative example arrangement includes additional functionality, such as control lines coupled to external circuits to place circuit 300 of FIG. 3 in the standby state following events such a power up or the occurrence of errors.

In the example of FIG. 3, capacitors 305 and 307 provide isolation between the transmit portion 341 (FIG. 3) and the receive portion 343 (FIG. 3). Alternative example arrangements include isolation devices other than capacitors that provide nonconductive coupling such as transformers or optical devices used for isolation with corresponding changes to circuit 300 (FIG. 3).

Figure 7A:
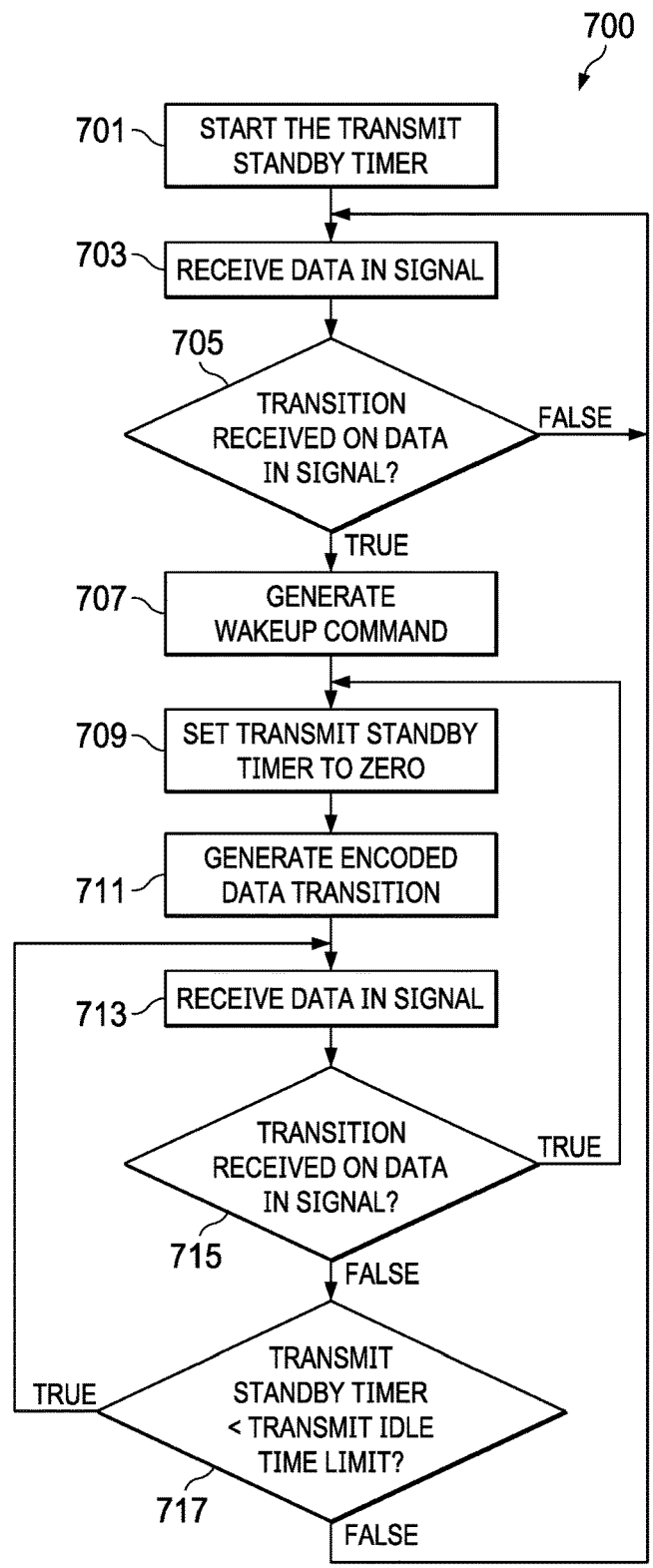
FIGS. 7A-7B (collectively "FIG. 7") are flow diagrams of an example method.
Figure 7B:
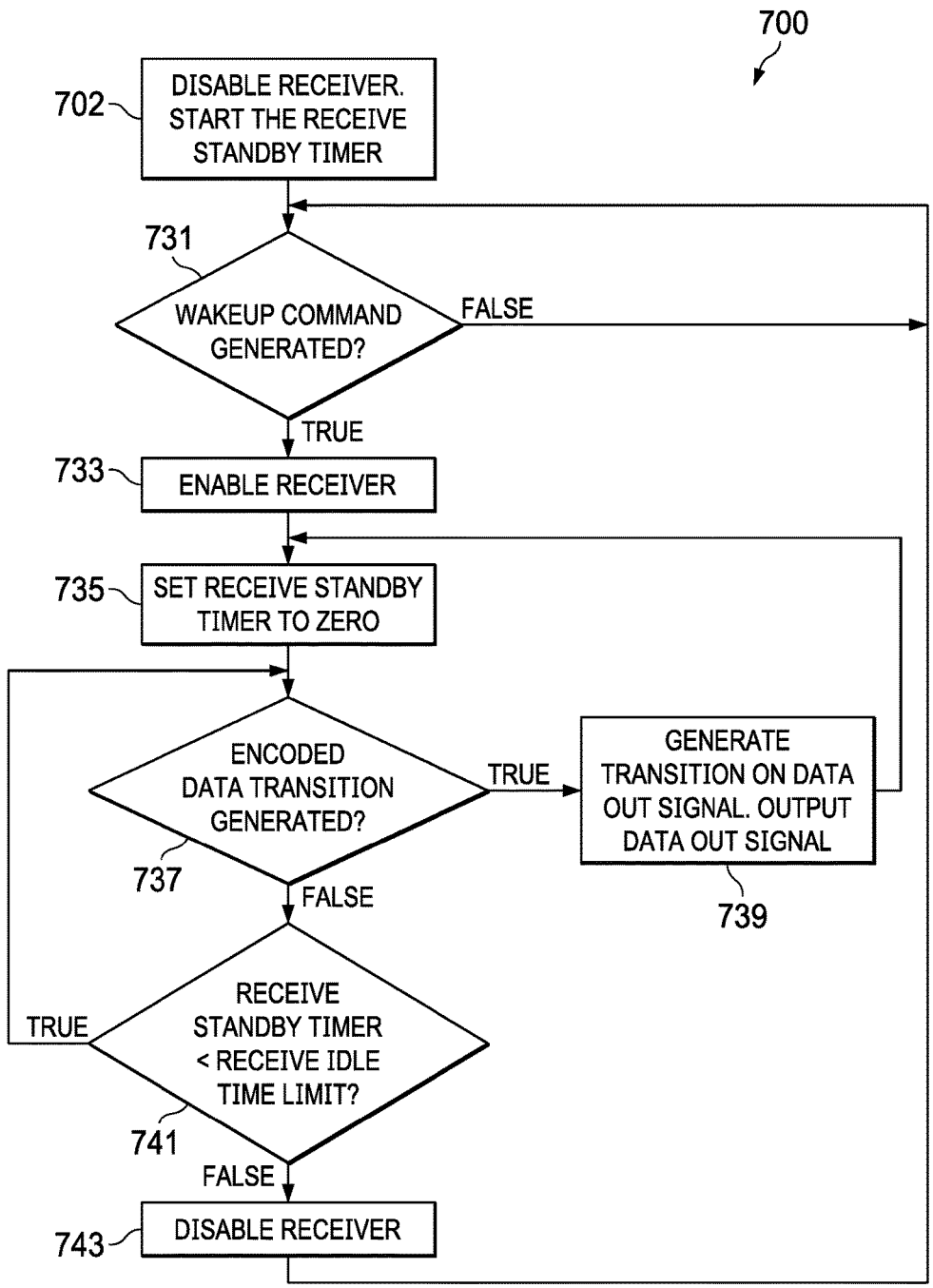

FIGS. 7A-7B are a flow diagram of an example method 700. Method 700 begins with steps 701 (FIG. 7A) and 702 (FIG. 7B) in parallel. Step 701 starts the transmit standby timer. From step 701, the method transitions to step 703. Step 702 disables the receiver and starts the receive standby timer. From step 702, the method transitions to step 731.

Referring to FIG. 7A, step 703 receives the signal "DATA IN." From step 703, the method transitions to step 705.

Step 705 determines whether a transition occurs on the signal DATA IN. If so, method 700 transitions to step 707. Or, if no transition occurs on the signal DATA IN, method 700 transitions to step 703. Step 707 generates a wakeup command (see step 731). From step 707, the method transitions to step 709.

Step 709 sets the transmit standby timer to zero (however, the timer continues running). From step 709, the method transitions to step 711. Step 711 provides an encoded representation of the type transition on the signal DATA IN (see steps 703, 705, 713, and 715). Examples of the types of transitions on the signal DATA IN are a rising voltage edge and a falling voltage edge. From step 711, the method transitions to step 713.

Step 713 receives the signal DATA IN. From step 713, the method transitions to step 715. Step 715 determines whether a transition occurs on the signal DATA IN. If so, method 700 transitions to step 709. Or, if no transition occurs on the signal DATA IN, method 700 transitions to step 717. Step 717 determines whether the transmit standby timer indicates that the transmit idle time limit has not been reached. If so, method 700 transitions to step 713. Or if not, method 700 transitions to step 703.

Referring to FIG. 7B, step 731 determines whether step 707 generated a wakeup command. If so, method 700 transitions to step 733. Or if not, step 731 repeats. The wakeup command generated in step 707 is momentary with a duration of sufficient time for step 731 to detect this command. Step 733 enables the receiver. From step 733, the method transitions to step 735.

Step 735 sets the receive standby timer to zero (the timer continues to run). From step 735, the method transitions to step 737.

Step 737 determines whether step 711 generated an encoded data transition. If so, method 700 transitions to step 739. When enabled, receiver 327 (see steps 702, 733, and 743) detects the occurrence of an encoded data transition and identifies the type of transition represented by this encoding. Step 739 generates a transition on the signal "data out" corresponding to the encoded data transition (see step 711). From step 739, the method transitions to step 735.

Referring again to step 737 in FIG. 7B, if step 711 (see FIG. 7A) did not generate an encoded data transition, method 700 transitions to step 741. Step 741 determines whether the receive standby timer indicates that the receive idle time limit has not been reached. If so, method 700 transitions to step 737. At step 741, if the receive standby timer indicates that the receive idle time limit has been reached, method 700 transitions to step 743. Step 743 disables the receiver and method 700 transitions to step 731. The receive idle time limit (see step 741) and the transmit idle time limit (see step 717 in FIG. 7A) can be approximately equivalent or differ depending on the characteristics of a specific implementation of the method 700.

The order of steps illustrated in the example of FIGS. 7A-7B illustrates one approach to performing the method 700. Alternative examples use a different order of steps, such as by reversing the order of steps 709 and 711.

Other alternative examples provide additional functionality to method 700, such as by modifying method 700 with additional steps that receive a transmit reset or similar signal and transition to step 703 when this reset occurs. In other examples, additional steps receive a reset or similar signal and transition to step 743. Alternative examples do not include transmit and receive standby timers. In this alternative example, the following modifications are made to the method 700: step 701 is removed; the method starts at steps 703 and 702 in parallel; step 709 is removed; step 707 transitions to step 711; step 711 transitions to step 703; steps 713, 715 and 717 are removed; the function "start the receive standby timer" is removed from step 702; steps 735, 737, 741 and 743 are removed; step 733 transitions to step 739; and step 739 transitions to step 702.

Modifications are possible in the described example arrangements, and other example arrangements are possible within the scope of the claims.

What is claimed is:

1. An integrated circuit, comprising:
   a receive portion having first and second inputs, and including at least one switch, the receive portion being configured to operate in: a wake mode in which the receive portion is capable of receiving an encoded transmission via the first input; and a sleep mode in which the switch decouples the first input to make the receive portion incapable of receiving the encoded transmission via the first input; and
   a wakeup controller having a third input coupled to the first input, and having an output coupled to the second input, the wakeup controller being configured to: monitor the first input for a wakeup signal; and responsive to the wakeup signal, provide a signal at the output to cause the receive portion to enter the wake mode.

2. The integrated circuit of claim 1, wherein the receive portion is configured to enter the sleep mode following a time-out period after entering the wake mode.

3. The integrated circuit of claim 1, wherein the receive portion is configured to enter the sleep mode after receiving the encoded transmission.

4. The integrated circuit of claim 1, wherein the output is a first output, and the wakeup controller includes: at least one preamplifier coupled to the first input, and having a second output; and at least one Schmitt trigger circuit coupled to the second output.

5. The integrated circuit of claim 1, wherein the output is a first output, and the receive portion includes: a receiver circuit coupled through the switch to the first input, and having a second output; and an output logic circuit coupled to the second output, the output logic circuit being configured to receive and decode the encoded transmission from the second output when the receive portion is in the wake mode.

6. The integrated circuit of claim 1, wherein the first input is adapted to be nonconductively coupled to a transmit portion.

7. The integrated circuit of claim 1, wherein the first input is a differential pair.

8. A signal isolation circuit, comprising:
   a line;
   a transmit portion having a first input, and having a first output coupled to the line, the transmit portion being configured to transmit a wakeup signal on the line, followed by an encoded transmission on the line, the encoded transmission representing an input signal at the first input;
   a receive portion having a second input coupled to the line, and having a third input, the receive portion being configured to operate in: a wake mode in which the receive portion is capable of receiving the encoded transmission via the second input; and a sleep mode in which the receive portion is incapable of receiving the encoded transmission via the second input; and
   a wakeup controller having a fourth input coupled to the line, and having a second output coupled to the third input, the wakeup controller being configured to: monitor the line for the wakeup signal; and responsive to the wakeup signal, provide a signal at the second output to cause the receive portion to enter the wake mode.

9. The signal isolation circuit of claim 8, wherein the receive portion is configured to enter the sleep mode following a time-out period after entering the wake mode.

10. The signal isolation circuit of claim 8, wherein the receive portion is configured to enter the sleep mode after receiving the encoded transmission.

11. The signal isolation circuit of claim 8, wherein the wakeup controller includes: at least one preamplifier coupled to the line, and having a third output; and at least one Schmitt trigger circuit coupled to the third output.

12. The signal isolation circuit of claim 8, wherein the receive portion includes at least one switch configured to decouple the second input to make the receive portion incapable of receiving the encoded transmission via the second input when the receive portion is in the sleep mode.

13. The signal isolation circuit of claim 12, wherein the receive portion includes: a receiver circuit coupled through the switch to the second input, and having a third output; and an output logic circuit coupled to the third output, the output logic circuit being configured to receive and decode the encoded transmission from the third output when the receive portion is in the wake mode.

14. The signal isolation circuit of claim 8, wherein the line is nonconductively coupled to the transmit portion.

15. The signal isolation circuit of claim 8, wherein the line is a differential pair.

16. A method, comprising:
   receiving an input signal at a transmit portion;
   providing a first wakeup signal on a line in response to the input signal;
   receiving the first wakeup signal on the line at a wakeup controller;
   providing a second wakeup signal to a receive portion, the receive portion waking from a sleep mode in response to the second wakeup signal;
   transmitting an encoded transmission representing the input signal from the transmit portion to the receive portion on the line; and
   receiving the encoded transmission at the receive portion, and decoding the encoded transmission.

17. The method of claim 16, wherein the line nonconductively couples the receive portion and the transmit portion.

18. The method of claim 16, wherein the encoded transmission includes ringing bursts.

19. The method of claim 16, wherein the encoded transmission encodes rising and falling edges of the input signal.

* * * * *